US006557149B2

(12) United States Patent
Morrise et al.

(10) Patent No.: US 6,557,149 B2
(45) Date of Patent: Apr. 29, 2003

(54) ALGORITHM FOR FINDING VECTORS TO STIMULATE ALL PATHS AND ARCS THROUGH AN LVS GATE

(75) Inventors: Matthew C. Morrise, Portland, OR (US); Kenneth S. Stevens, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 75 days.

(21) Appl. No.: 09/825,813

(22) Filed: Apr. 4, 2001

(65) Prior Publication Data

US 2002/0145433 A1 Oct. 10, 2002

(51) Int. Cl.[7] .............................................. G06F 17/50
(52) U.S. Cl. .................................. 716/4; 716/7; 703/16; 703/17; 703/28
(58) Field of Search ..................... 716/1–18; 703/14–17, 703/28

(56) References Cited

U.S. PATENT DOCUMENTS

| 4,775,942 A | * | 10/1988 | Ferreri et al. .................... 716/8 |
| 5,539,306 A | * | 7/1996 | Riggio, Jr. ................. 324/158.1 |
| 5,550,760 A | * | 8/1996 | Razdan et al. ................. 703/14 |
| 5,838,578 A | * | 11/1998 | Pippin ............................. 716/4 |
| 5,838,947 A | * | 11/1998 | Sarin ............................. 703/14 |
| 5,867,397 A | * | 2/1999 | Koza et al. .................... 703/14 |
| 5,943,488 A | * | 8/1999 | Raza ........................... 716/19 |
| 6,038,386 A | * | 3/2000 | Jain ............................. 716/16 |
| 6,374,393 B1 | * | 4/2002 | Hirairi ............................ 716/8 |
| 6,405,100 B1 | * | 8/2002 | Djaja et al. .................... 703/24 |
| 6,434,736 B1 | * | 8/2002 | Schaecher et al. ............ 716/17 |
| 6,442,735 B1 | * | 8/2002 | Joshi et al. ..................... 716/4 |

OTHER PUBLICATIONS

NN86112616, "Dynamic Random–Access Memory Sense Amplifier Latch Set", IBM Technical Disclosure Bulletin, vol. 29, No. 6, Nov. 1986, pp. 2616–26–17 (4 pages).*
Betts et al., "Investigation of a switched–capacitor integrator–pair with low–sensitivity to non–ideal op–amp effects", IEE 1988 Saraga Colloquium on Electronics Filters, Jan. 1988, pp. 3/1–3/11.*
To et al., "A flexible parameter mismatch sensitivity analysis for VLSI design", IEEE, Southcon/96 Conference Record, Jun. 25, 1996, pp. 363–366.*
NN75122073, "Amplifier and Load Protection and Failure Detection via Current Sensing", IBM Technical Disclosure Bulletin, vol. 18, No. 7, pp. 2073–2075 (4 pages), Dec. 1975.*

* cited by examiner

Primary Examiner—Matthew Smith
Assistant Examiner—Phallaka Kik
(74) Attorney, Agent, or Firm—Kenyon & Kenyon

(57) ABSTRACT

A method and system for characterizing and validating the timing of LVS circuits. In particular, based upon an input of a topological description of an LVS circuit (e.g., a netlist) and other circuit parameters such as a clock specification or any mutex or logical correlations between inputs and ignored devices, an output of all paths and arcs from primary inputs to sense amplifier inputs is generated. A complete set of valid input vectors required to exercise all paths is generated. These vectors may then be exhaustively simulated to provide input waveforms to all sense amplifiers.

17 Claims, 15 Drawing Sheets

FIG. 5A — 501

- TRANSISTOR ID 505
- SOURCE NODE 510
- DRAIN NODE 515
- GATE NODE 516
- FUNCTION 520
- STATUS 522

FIG. 5B — 517

- NODE ID 530
- CORRELATION DATA OBJECT 537
- SOURCE 536
- STATUS 539

FIG. 5C — 527

- SENSE AMPLIFIER ID 540
- + INPUT NODE 545
- − INPUT NODE 547
- + OUTPUT NODE 549
- − OUTPUT NODE 551

FIG. 5D — 537

- CORRELATION TYPE 555
- STRING POINTER 557
- AUXILARY INFORMATION 1 559
- AUXILARY INFORMATION 2 561

ALGORITHM FOR FINDING VECTORS TO STIMULATE ALL PATHS AND ARCS THROUGH AN LVS GATE

FIELD OF THE INVENTION

The present invention relates to the areas of digital circuits and digital logic. In particular, the present invention provides a method and system for determining vectors to stimulate all paths and arcs through an LVS ("Low Voltage Differential Sense") circuit.

BACKGROUND INFORMATION

LVS circuits are being developed as a means to decrease circuit area, increase throughput and consume less power than other circuit families. LVS circuits utilize large networks of precharged dual rail gates with low voltage outputs and sense amplifiers to restore the output to full rail signals.

LVS is implemented using pass-gate technology where only n-type gates are used to pass logic values in a source-follower configuration. FIG. 1A illustrates a topology of an LVS gate according to one embodiment of the present invention. Note that the topology depicted in FIG. 1A is merely exemplary and is not intended to limit the scope of the present invention. Referring to FIG. 1A, note that the logic utilizes a dual-rail protocol (105a, 105b) where a pair of wires encode data values of one and zero. The idle state is encoded with both wires reset. A logic one or zero is physically represented with one wire pulled high and the other low. Latching circuit 110, which is controlled by domino clock 115 is coupled to DCN ("Diffusion Connected Network") via rails 105a and 105b. Reset of DCN 120 is controlled via reset clock. The dual-wire pair 105a, 105b is coupled to sense amplifier ("SA") 130, which can detect and latch very small differentials between wire pairs 105a and 105b. SA 130 is clocked via sense amplifier clock 135 and is further coupled to CDL ("Clocked Differential Logic") block 140, the output of which may be used to drive other LVS gates.

FIG. 1B depicts a block schematic for an LVS circuit according to one embodiment of the present invention. As shown in FIG. 1B, DCN network 120 includes function (F) 160a and function complement (F') networks 160b, which each respectively feed an input of SA 130. Each network 160a includes transistors functioning as drive transistors 170, pass transistors 180 and reset transistors 190.

LVS gates offer significant advantages over static or domino logic for particular topologies and logic functions, particular AND and MUX operations. In particular, significant amounts of logic can be placed in the pass-gate network (DCN 120), which is equivalent to several stages of static or domino logic that would be required to implement the same function. Therefore, the overhead of sense amplifiers can be compensated by the decreased single-stage latency of the pass-gate function. The ability to push complex logic in the pass gate chain also significantly minimizes area when compared with other implementations. Further, LVS technology offers the advantage that it can run at double clock frequency since an LVS pipeline includes fewer logic levels than standard clocked pipelines (clocked FF/CDL, pass gate chain, p-SA, n-CDL). In addition, LVS circuits consume less power due to the reduced size of the transistors.

FIGS. 2A–2B illustrate a number of CMOS ("Complementary Metal Oxide Semiconductor") gates and exemplary LVS counterparts according to one embodiment of the present invention. In particular, FIG. 2A compares the topology for an inverter implemented using CMOS technology 205 and the DCN 120 of an inverter implemented using LVS technology 210. Note, in particular, the dual rail topology of the inverter using LVS technology 210. That is, dual rail inputs $\alpha$ and $\bar{\alpha}$ are cross-coupled to respective outputs z and $\bar{z}$. FIG. 2B compares the topology for an exclusive or ("XOR") gate implemented using CMOS technology and using LVS technology.

The topology of LVS circuits present novel challenges for performing simulation and timing analysis, which are not tractable by standard timing and analysis tools directed toward typical static or dynamic gates (e.g., CMOS or domino gates). The pass-gate networks in current implementations may run from tens of transistors per DCN to thousands of transistors. Each of the DCNs can be viewed as a single very complex gate. While these gates have a single DCN like other standard logic gates (e.g., AND gates), they differ in complexity because these networks can be comprised of hundreds of inputs and outputs and thousands of transistors.

The clocking of an LVS block is also more complex than other logic families such as domino logic. LVS blocks can have multiple pulsed clocks. These circuits typically operate in a mode where many of the inputs are designed to switch simultaneously and this effect can have a significant impact on the delay through the DCN due to Miller capacitance. Skew between the arrival time of input levels can also significantly change the delay through the pass-gate network since skew differences can alter the charge steering routes through the DCN.

Furthermore, a single arc from an input to a sense amplifier can be enabled by one or more valid input vectors. Typically, all possible vectors must be found to enable all arcs and paths through an LVS block. Many of these arcs are subsets of other arcs. The complexity of vectors can grow exponentially but may be bounded by $O(n^2)$.

The custom nature of LVS circuits coupled with their size, clocking complexity and dual-rail differential signal sensing result in a circuit class that is unsupported by standard timing tools. Correctly validating the timing of LVS circuits is critical to efficient production. In particular, the following criteria are necessary for accurate analysis of LVS circuits:

1) Timing validation tools that require little designer intervention;
2) Accurate characterization;
3) Validation of the timing of an LVS block as a function of arrival times and variations in clocks and input signals;
4) A timing model that can be used by higher level timing tools. An LVS block has high impedance inputs and full-swing outputs that support higher level timing analysis (e.g., PathMill black boxes);
5) Reporting structure that indicates slacks and vectors to exercise the circuit for these slacks so that the designer can improve the circuit and repair any violations;
6) Cross-platform compatibility.

BRIEF DESCRIPTION OF THE DRAWINGS

FIG. 5A depicts a data structure for representing a transistor object according to one embodiment of the present invention.

FIG. 5B depicts a data structure for representing a node in an LVS circuit according to one embodiment of the present invention.

FIG. 5C depicts a data structure for representing a sense amplifier in an LVS circuit according to one embodiment of the present invention.

FIG. 5D depicts a data structure for representing a correlation data object according to one embodiment of the present invention.

DETAILED DESCRIPTION

The present invention provides a method and system for characterizing and validating the timing of LVS circuits. In particular, based upon an input of a topological description of an LVS circuit (e.g., a netlist) and other circuit parameters such as a clock specification or any mutex or logical correlations between inputs and ignored devices an output of all paths and corresponding arcs from primary inputs to sense amplifier inputs is generated. According to one embodiment, based upon the analysis of an LVS circuit, a complete set of valid input vectors required to exercise all paths is generated. These vectors can then be exhaustively simulated using a transistor level circuit simulator (e.g., SPICE) to calculate the slowest differential development at all SAs.

According to one embodiment, transistors are characterized into a number of "bins" based upon their topology and/or function. As a function of the circuit characteristics, p-MOS transistors connected to power and a LVS DCN are treated as "drive" transistors in that they actively perform a pull-up function for a network asserting a dual-rail 1 or 0 on SA inputs. N-MOS transistors connected to ground and a DCN network are treated as "reset" transistors in that they can be used to precharge the dual-rail DCN lines to ground and may also actively pull a line low during evaluation to assert a dual-rail 0 or 1. All transistors whose source and drain are connected to the DCN are treated as pass gates.

According to one embodiment, all paths are determined by setting drive and reset transistors and then opening and closing all pass transistors until all paths are determined. In particular, all paths are determined by starting with a p-MOS transistor and tracing through the network until a node is found that drives the gate of a SA.

Furthermore, the present invention allows the circuit designer to specify logical or mutex relationships between nodes in the LVS circuit in order to facilitate the generation of valid paths.

Figure 1A:
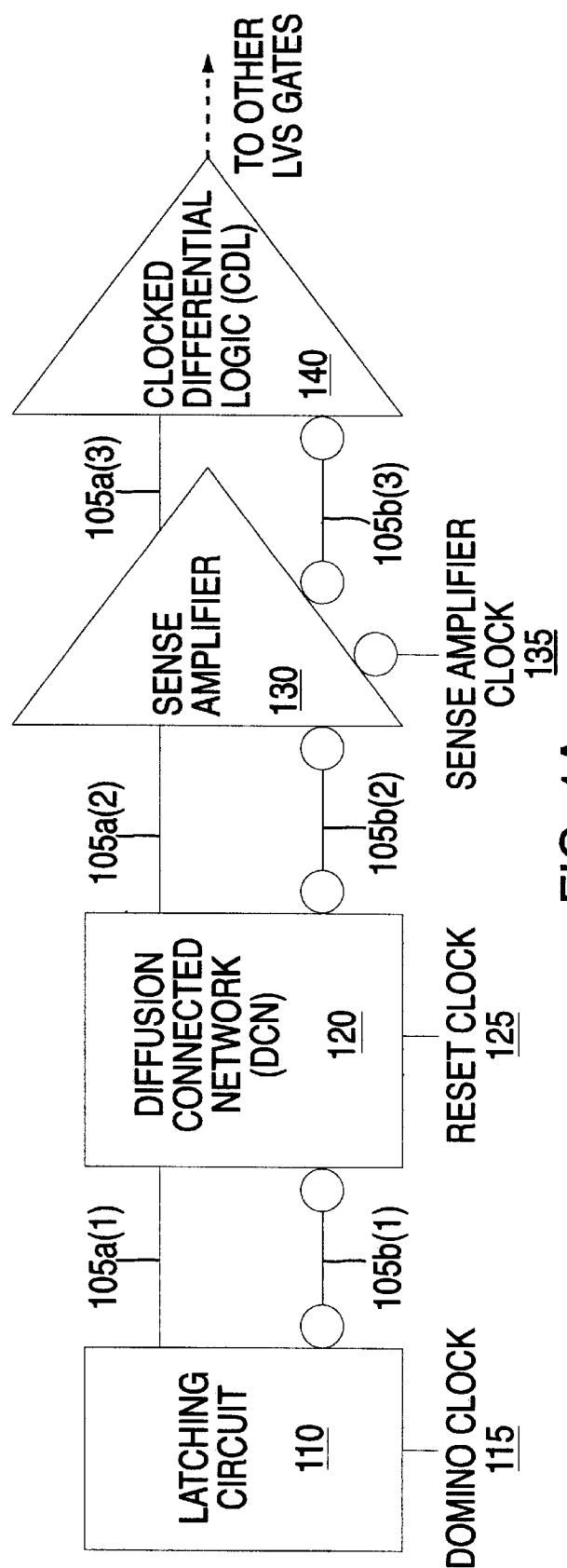
FIG. 1A illustrates a topology of an LVS gate according to one embodiment of the present invention.
Figure 1B:
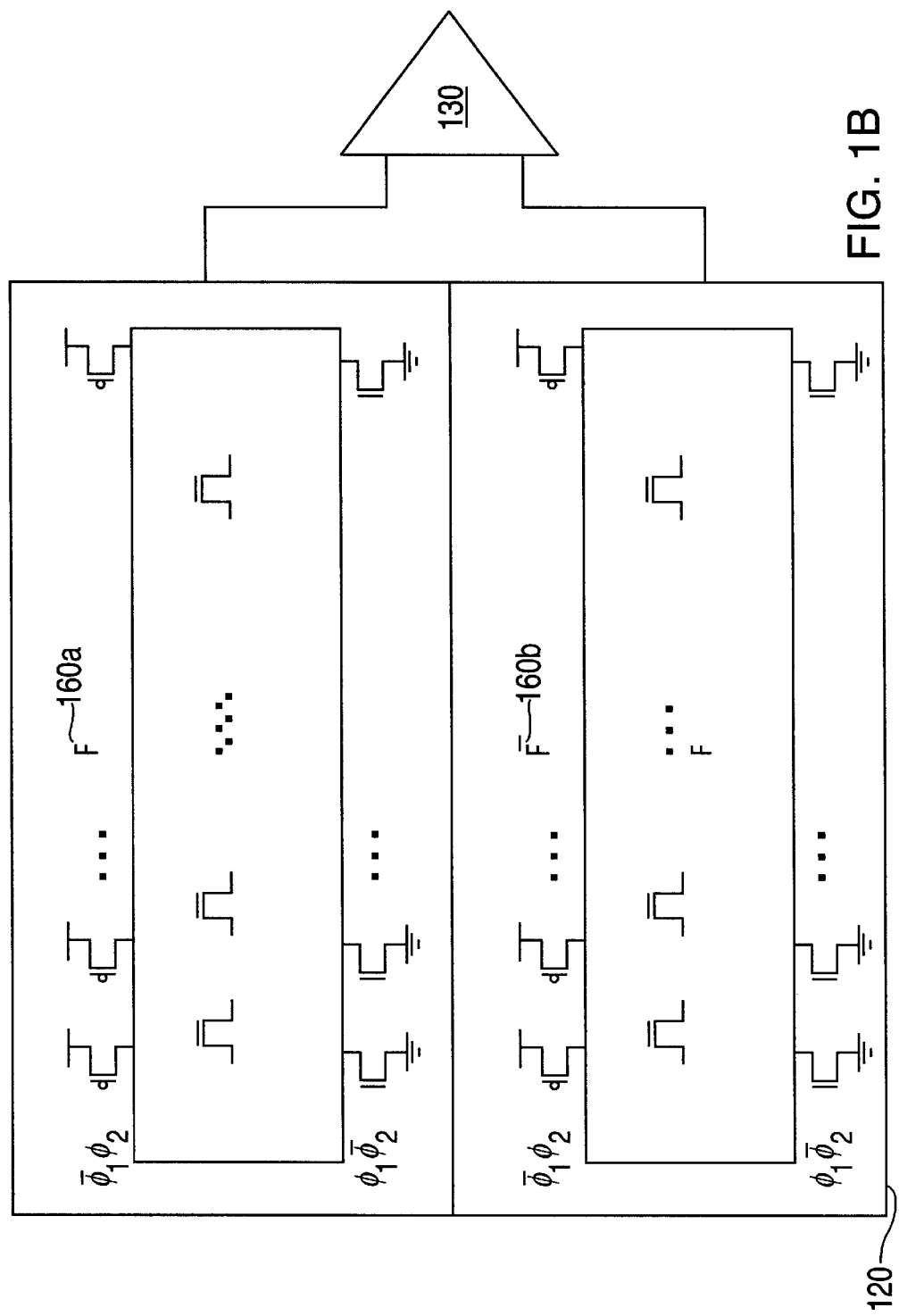
FIG. 1B depicts a block schematic for an LVS circuit according to one embodiment of the present invention.
Figure 2A:
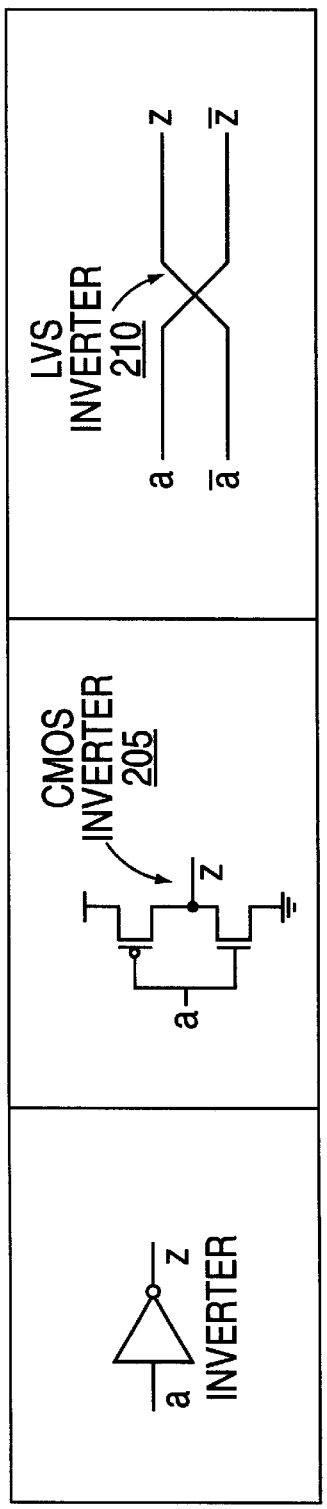
FIG. 2A compares the topology for an inverter implemented using CMOS technology and the DCN of an inverter implemented using LVS technology.
Figure 2B:
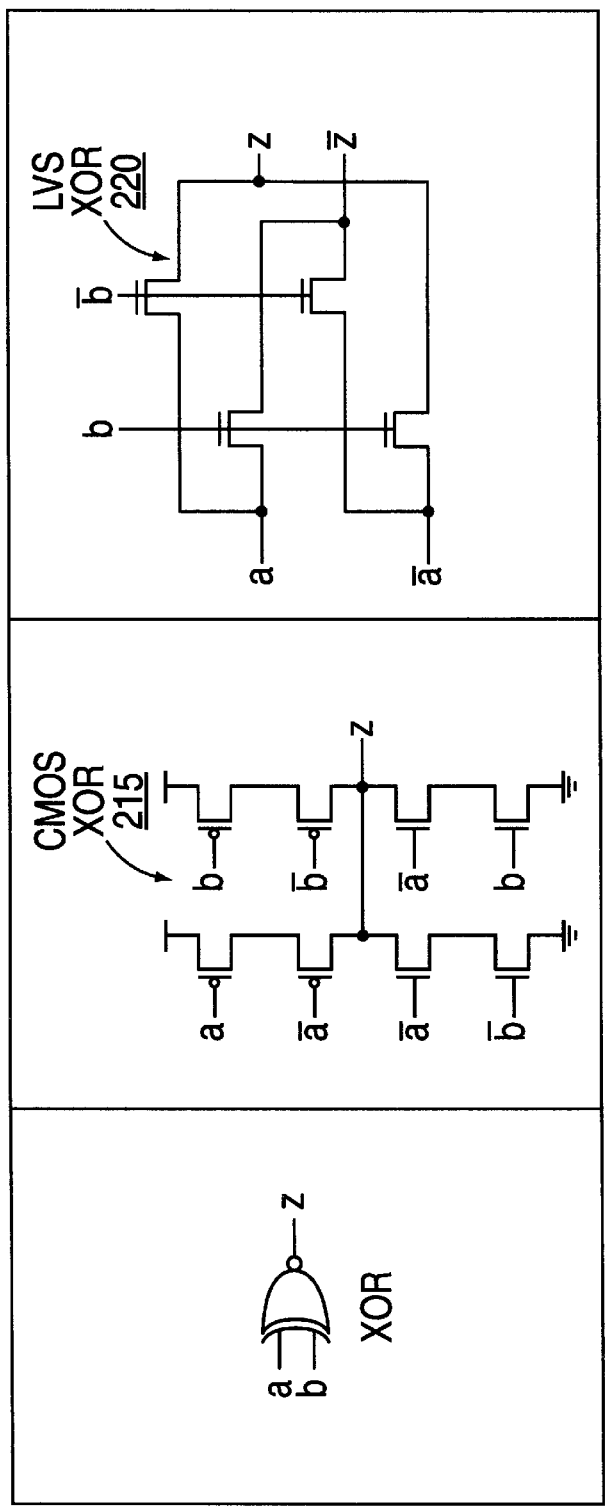
FIG. 2B compares the topology for an exclusive or ("XOR") gate implemented using CMOS technology and using LVS technology.
Figure 3:
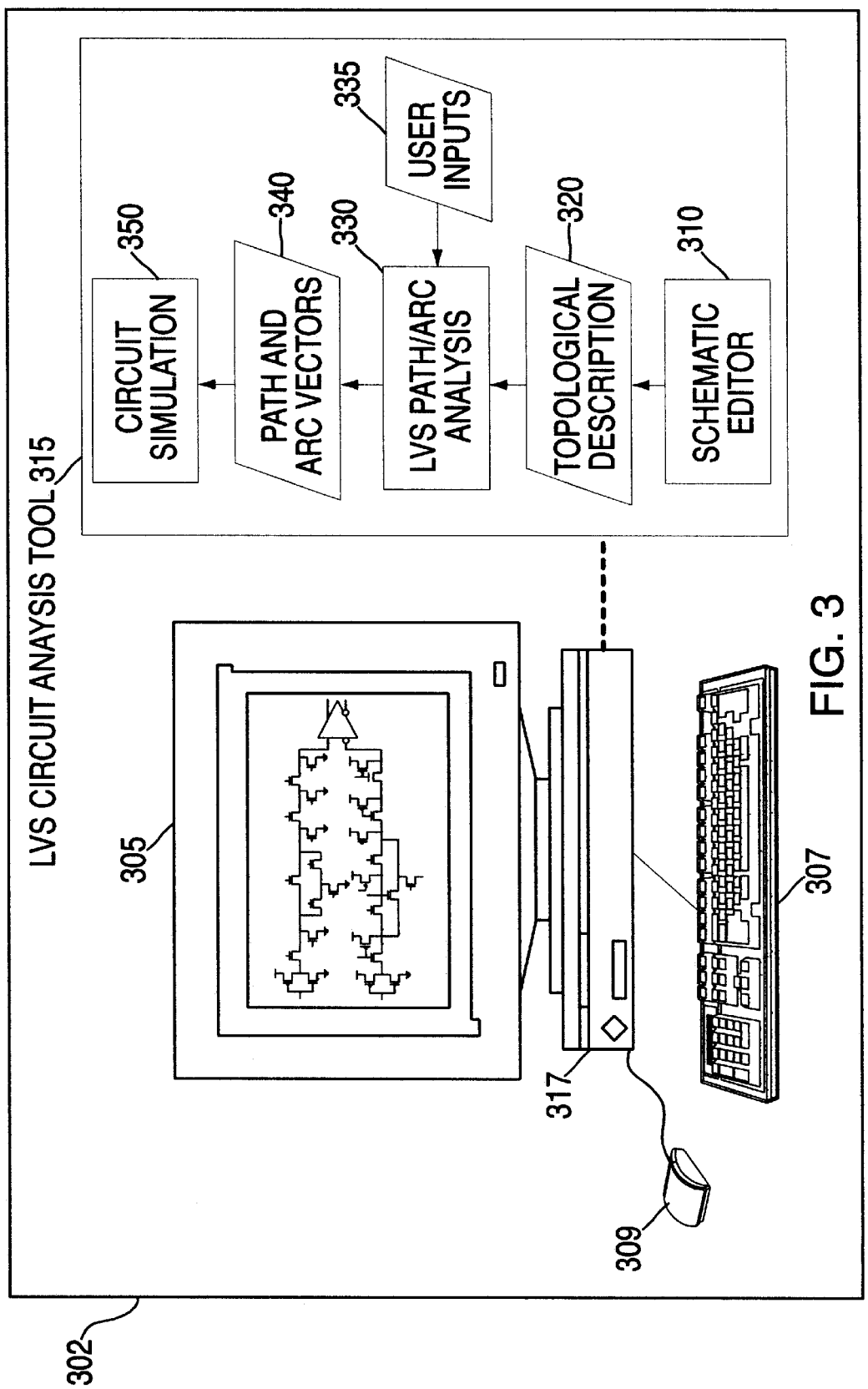
FIG. 3 depicts a LVS circuit analysis system and its relationship with an LVS circuit analysis tool according to one embodiment of the present invention.

FIG. 3 depicts a LVS circuit analysis system and its relationship with an LVS circuit analysis tool according to one embodiment of the present invention. As shown in FIG. 3, LVS circuit analysis system 302 includes CPU device 317, which further includes respective input and output interfaces. The present invention is compatible and may be implemented utilizing any CPU platform including those based upon the Pentium® line of microprocessors produced by Intel® Corporation, Santa Clara, Calif. Furthermore, CPU device 317 may utilize any operating system including the Windows® operating system produced by Microsoft Corporation, Redmond, Wash. as well as UNIX based operating systems or Linux. Input interfaces may include keyboard 307, mouse 309 etc. Output interfaces may include a CRT ("Cathode Ray Tube") screen 305, printer (not shown) etc. According to one embodiment of the present invention, CPU device 315 executes a number of processes, which comprise LVS circuit analysis tool 315.

According to one embodiment, LVS circuit analysis tool 315 performs processes to perform LVS circuit analysis and simulation including schematic editor process 310, LVS path/arc evaluation process 330 and circuit simulation process 350. Schematic editor process 310 receives input from a circuit designer (not shown) relating to an overall LVS circuit schematic (i.e., a circuit topology, logical and mutex relationships, ignored devices, circuit characteristics etc.). According to one embodiment, input parameters may be generated from a schematic software process 310, which is integrated into LVS circuit analysis tool 315.

Schematic editor process 310 provides a GUI ("Graphical User Interface") for a circuit designer to build a LVS circuit topology in a graphical fashion. Schematic editor process 310 generates topological description output, 320 which, for example, may be a netlist description of the LVS circuit. Typically, topological description output includes at least connectivity information for all transistors in an LVS circuit, a list of nodes as well as a designation of all primary inputs and primary outputs to the circuit.

LVS path/arc analysis process 330 receives topological description 320 and user inputs 335 as inputs. User input 335 may include mutex or logical correlation information for transistors as well as designation that certain circuit devices should be ignored. In addition, according to one embodiment, user inputs 335 includes circuit characteristics, which indicate, among other things, the nature of the clocking scheme in the circuit such as whether pre-charge is high or low as well as other information necessary for determining functions of transistors within the LVS circuit.

LVS path/arc analysis process 330 analyzes the LVS circuit utilizing topological description 320 and as a further function of user inputs 335 determines all paths and arcs in the LVS circuit. A detailed description of the LVS path/arc analysis process is described below. However, in general, LVS path/arc analysis process 330 generates path and arc vectors 340 as output. Data structures for representing path and arc vectors as generated by LVS path/arc analysis process 330 are described in detail below. Path and arc vectors 340 are received as input by circuit simulation tool 350, which performs timing analysis and circuit verification as a function of these inputs. For example, circuit simulation tool may include commercial products such as SPICE or P-SPICE.

Figure 4:
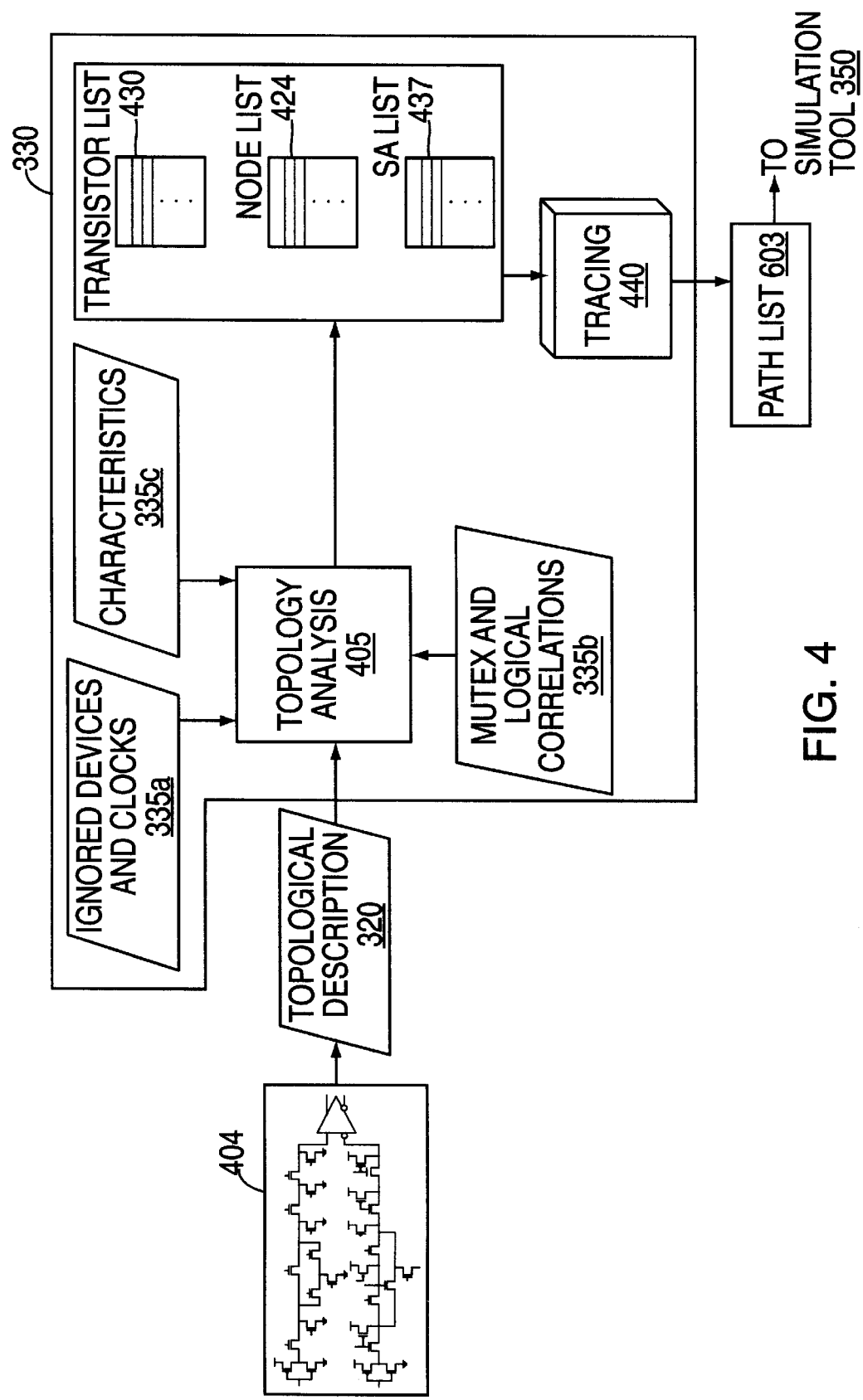
FIG. 4 depicts a structure of an LVS arc/path analysis tool including input data structures and processes according to one embodiment of the present invention.

FIG. 4 depicts a structure of an LVS arc/path analysis tool including input data structures and processes according to one embodiment of the present invention. As shown in FIG. 4, topological description 320 is generated from LVS circuit schematic 404. Topology analysis process 405 receives input data including topological description 320, ignored devices and clocks data 335a, input and logical correlations data 335b and characteristics data 335c and analyzes the structure and function of devices in the LVS circuit.

Topological description data 320 is typically a netlist generated by a schematic editor as described above. Thus, typically topological description data 320 will describe connections between transistors, power, ground and other devices as a function of nodes in the LVS circuit. Ignored devices and clocks data 335a specifies any devices in the LVS network that should be ignored by LVS circuit analysis tool 315 such as clocks and other devices designated by the circuit designer. Mutex and logical correlation data 335b specifies mutex and/or logical relationships between nodes in the LVS circuit. As will become evident as the invention is further described, mutex and logical correlation data is utilized for effectively determining arcs and paths through the LVS circuit. Characteristics data 335c indicates various parameters chosen by the circuit designer including, for example, whether transistors are pre-charged high or low, whether p-MOS or n-MOS sense amplifiers are utilized etc.

As a function of topological description data 320, mutex and logical correlation data 335, ignored devices and clocks data 335a and characteristics data 335c, topology analysis process 405 characterizes transistors included in the LVS circuit into a number of "bins" based upon their topology and/or function. For example, in a circuit scheme where nodes are pre-charged low, P-MOS transistors connected to power and a LVS DCN 120 are treated as "drive" transistors in that they actively perform a pull-up function for a network asserting a dual-rail 1 or 0 on SA inputs. N-MOS transistors connected to ground and a DCN network are treated as "reset" transistors in that they can be used to pre-charge the dual-rail DCN lines to ground and may also actively pull a line low during evaluation to assert a dual-rail 0 or 1. All transistors whose source and drain are connected to the DCN are treated as pass gates. Of course, in a LVS circuit where nodes were pre-charged high, typically N-MOS transistors would be treated as drive transistor and P-MOS transistors would be treated as reset transistors. Of course, these characteristics are determined by the circuit designer and the present invention is compatible with any scheme desired, even, for example, a situation where nodes were pre-charged low and N-MOS transistors were used as drive transistors. In general, information regarding the LVS circuit characteristics are specified in characteristics data 335c. Thus, note that this embodiment is merely exemplary. According to an alternative embodiment where DCN lines are pre-charged high, typically P-MOS transistors would be characterized as reset transistors and N-MOS transistors connected to ground would be characterized as drive transistors. In this case, pass transistors would typically be P-MOS. However, these embodiments do not limit the scope of the invention. In general present invention is also compatible with any scheme and may be specified in scheme data 335c.

As a function of topological description data 320, ignored devices data 335a and mutex and logical correlations data 335b and characteristics data 335c, topology analysis process 405 generates transistor list 430, node list 424 and SA list 437. Transistor list 430 is a list of all transistors in the LVS circuit characterized by function. Node list 424 is a list of all nodes in the LVS circuit and SA list 437 is a list of all sense amplifiers in the LVS circuit. A detailed description of the operation of topology analysis process 405 in generating transistor list 430, node list 424 and SA list 437 is provide below with reference to FIG. 8. Furthermore, exemplary data structures for generating transistor list 430, node list 424 and SA list 437 are described in detail below with reference to FIG. 5.

Tracing process 440 receives transistor list 430, node list 424 and SA list 437 and as a function of these inputs, tracing process 440 generates path list 603, which includes at least one path data object representing a path and corresponding arcs through the LVS circuit. An exemplary data structure for representing path list 603 is described below with reference to FIG. 6.

FIG. 5A depicts a data structure for representing a transistor object according to one embodiment of the present invention. Transistor object 501 may, for example, be implemented utilizing a C++ or JAVA class architecture. As shown in FIG. 5a, transistor object includes member variables transistor ID 505, source node 510, drain node 515, gate node 516, function 520 and status 522. Transistor ID 505 stores a 32-bit value representing an identification of the transistor. Source node 510 stores a 32-bit identifier corresponding to a source node. Drain node 515 stores a 32-bit identifier corresponding to a drain node. Gate node 516 stores a 32-bit identifier corresponding to a gate node. Function member 520 stores a 2-bit value indicating the function of the transistor as a drive transistor, a reset transistor or a pass-gate transistor. According to one embodiment, for example, the binary values 00, 01, 10 refer to drive, reset and pass status respectively. Status member 522 is a 2-bit value utilized for marking a transistors during path tracing. According to one embodiment, the binary values 00 and 01 and 10 correspond respectively to the status indicators "not visited", "visited" and "ignored."

FIG. 5B depicts a data structure for representing a node in an LVS circuit according to one embodiment of the present invention. Node object 517 may, for example, be implemented utilizing a C++ or JAVA class architecture. As shown in FIG. 5b, node object 517 includes node ID member 530, correlation data object identifier 537, source member 536 and status member 539. Node ID member 530 stores a 32-bit identifier of a node in an LVS circuit. Correlation data object 537 stores a pointer to a correlation data object (described in detail below), which stores correlation data corresponding to the node. According to one embodiment of the present invention, correlation data for a node may include logical and/or mutex relationships. Source member 536 stores connectivity information for a node indicating whether the node is directly coupled to a particular source such as a voltage source (e.g., Vcc, Vss) or a clock or if the node is utilized as a reset node. Typically, during path tracing, nodes connected to clocks, Vcc, Vss or reset nodes are skipped as described in detail below. Status member 539 is a 2-bit value utilized for marking nodes during path tracing. According to one embodiment, the binary values 00 and 01 correspond respectively to the status indicators "not visited" and "visited."

FIG. 5C depicts a data structure for representing a sense amplifier in an LVS circuit according to one embodiment of the present invention. As shown in FIG. 5c, sense amplifier object 527 includes members sense amplifier ID 540, +input node 545, −input node 547, +output node 549 and −output node 551. Sense amplifier ID 540 stores a 32-bit identifier of a sense amplifier in an LVS circuit. +input node 545 stores a 32-bit identifier of a first input node to the sense amplifier. −input node 547 stores a 32-bit identifier of a second input node to the sense amplifier. +Output node 549 stores a 32-bit identifier of a first output node of the SA 130. −Output node 551 stores a 32-bit identifier of a second output node of the SA 130.

FIG. 5D depicts a data structure for representing a correlation data object according to one embodiment of the present invention. As described in detail below, correlation data object is utilized during path tracing to determine mutex and/or logical correlations between nodes. As shown in FIG. 5d, each correlation data object 537 includes member variables correlation type 555, string pointer 557, auxiliary information 1 559 and auxiliary information 2 561. Correlation type 55 stores an identifier indicating a type of correlation such as mutex or logical. String pointer 557 stores a pointer to a character array that represents the particular logical relation. According to one embodiment of the present invention, logical correlation is represented in a generic equation format (e.g., a&(!b+c)) where the equations are attached to nodes in the LVS circuit and the terms of the equation are primary inputs or auxiliary variables.

Auxiliary information fields 1 and 2 (559 and 561) store additional data relating to correlation data object 537.

Figure 6:
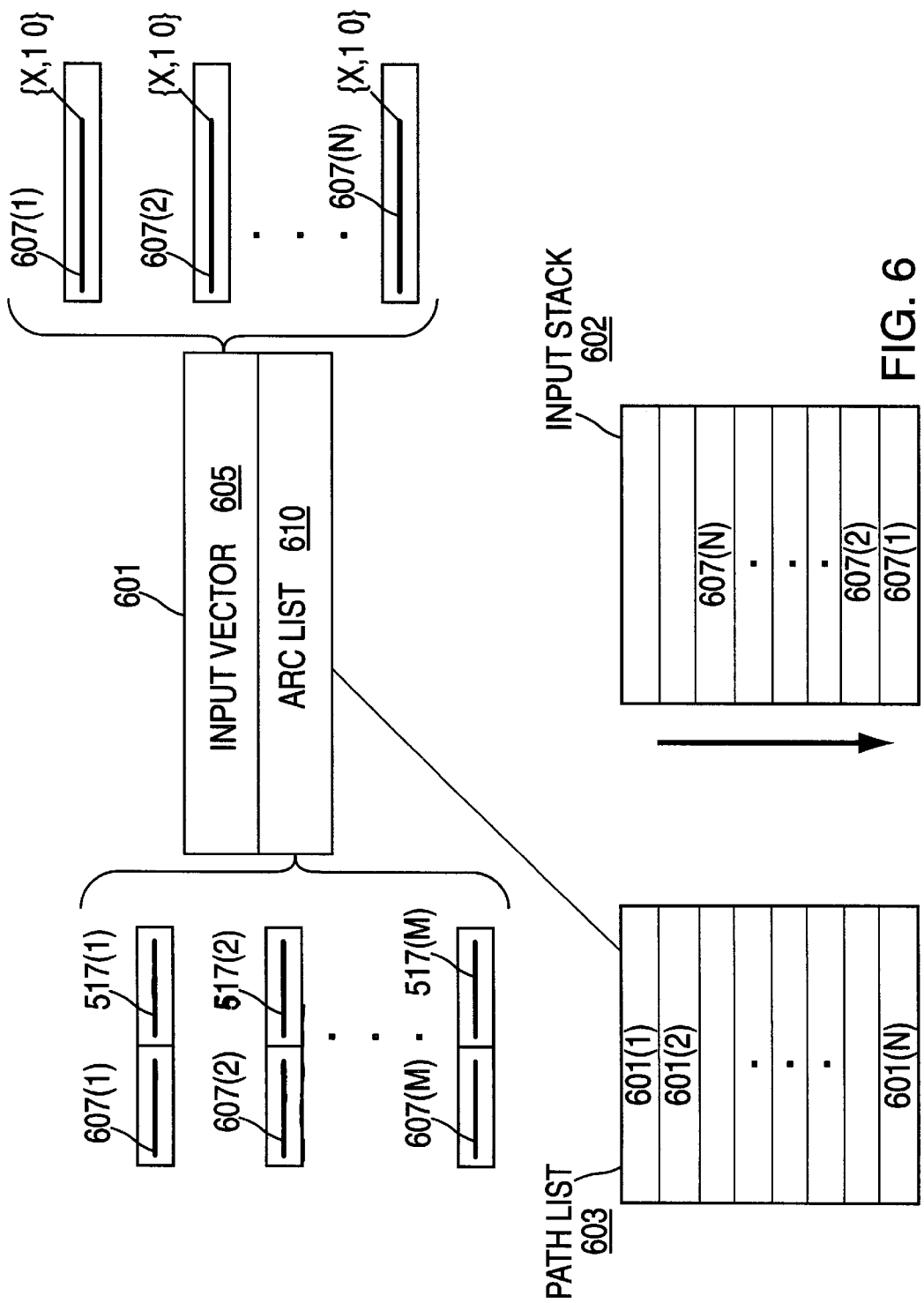
FIG. 6 depicts various data objects and corresponding data structures generated and utilized by a tracing processing according to one embodiment of the present invention.

FIG. 6 depicts various data objects and corresponding data structures generated and utilized by a tracing processing according to one embodiment of the present invention. In particular, FIG. 6 shows data structures generated as output by tracing process 440 as well as internal data structures utilized by tracing process 440 to maintain state. In particular, FIG. 6 depicts path list data structure 603. Tracing process generates path list 603 as output as a function of transistor list 430, node list 424 and SA list 437. According to one embodiment of the present invention, path list 603 stores a linked list of path data objects 601(1)–601(N). Although a linked list is represented in FIG. 6, note that the present invention is compatible with any type of data structure. Each path data object 601 represents a valid path and associated arc vectors from a drive transistor in the LVS circuit to a SA 130.

Each path data object 601 includes member variables input vector 605 and arc list 610. Input vector 605 stores a list (e.g., a linked list, an array, etc.) of primary input (i.e., gate) values for each primary input in the LVS circuit being analyzed (i.e., 607(1)–607(N)). Primary input values 607(1)–607(N) specified within a particular input vector corresponding to a valid path through the LVS circuit represent necessary input conditions to establish the path. In particular, as noted above, typically determination of primary inputs 607(1)–607(N) is provided from topological description 320. Thus, according to one embodiment, each primary input value 607 stores a two-bit binary values, representing the conditions high 1 (01), low 0 (00) or don't care X (10).

Arc list 610 stores linked list of arc vectors corresponding to the particular path indicated by path data object 601. In particular, according to one embodiment, arc list 610 stores a linked list of all arcs corresponding to a particular path. Thus, as shown in FIG. 610, arc list stores a linked list of 2-D vectors comprising a primary input 607 and primary output (indicated by node 517) pair corresponding to a particular path (i.e., (607(1), 517(1))–(607(1), 517(M))). Arc list 610 is utilized in conjunction with path data by circuit simulation tool to perform timing analysis and verification.

FIG. 6 also depicts input stack 602, which operates utilizing a traditional push-down stack architecture. Tracing process 440 utilizes input stack 602 during tracing operations for internally maintaining state. In particular, as described in detail below, during path tracing, tracing process pushes and pops primary input data values 607 to and from input stack 602. As will become evident as tracing process 440 is described in more detail below, upon tracing to a SA 130, input stack 602 is loaded with a valid path from a drive transistor to the SA.

Figure 7:
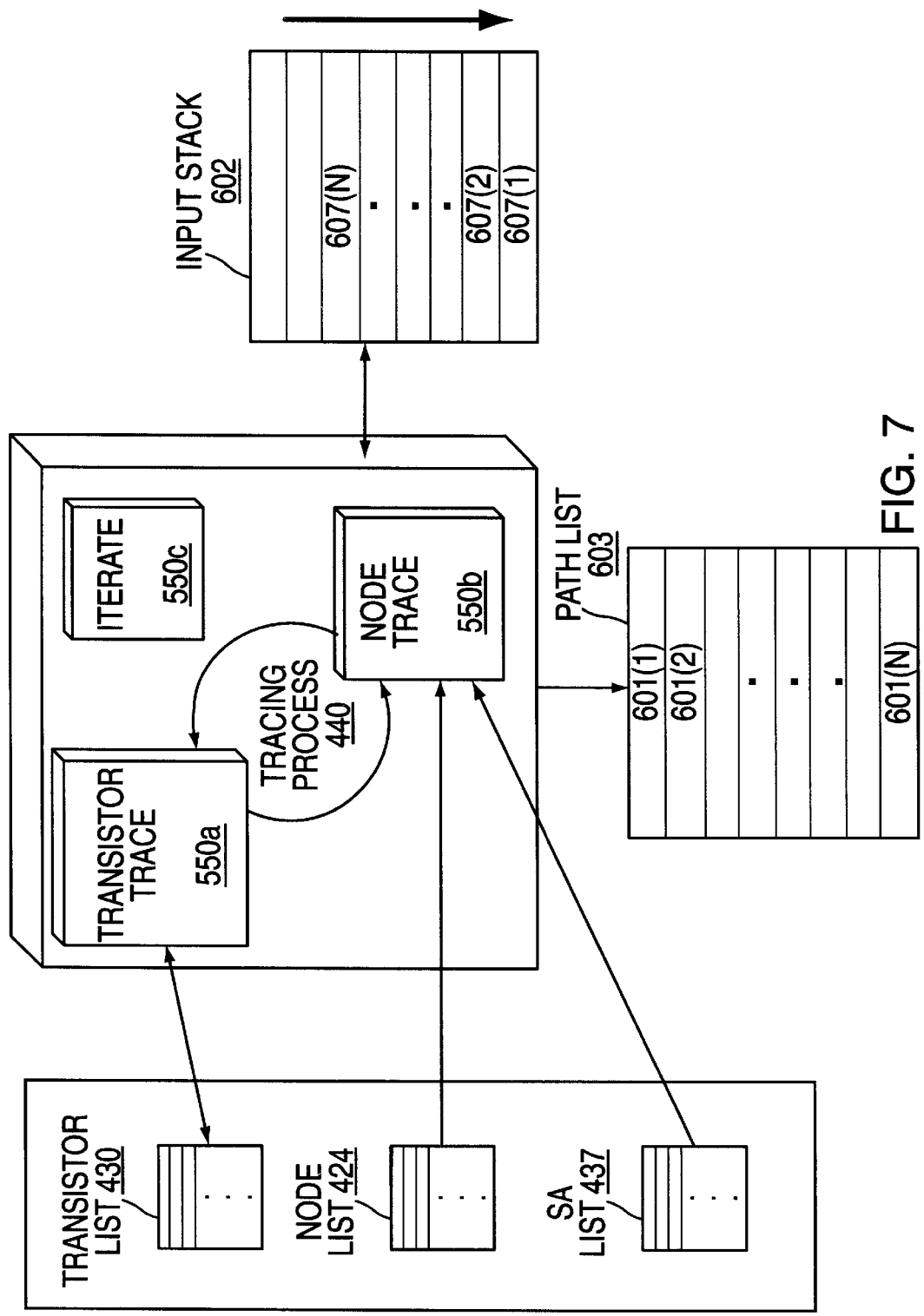
FIG. 7 is a block diagram that graphically depicts the internal operation of a tracing process according to one embodiment of the present invention.

FIG. 7 is a block diagram that graphically depicts the internal operation of a tracing process according to one embodiment of the present invention. According to one embodiment of the present invention tracing process 440 performs a depth-first search through an LVS circuit to determine paths and arcs. However, this embodiment is merely exemplary and not intended to limit the scope of the present invention. In general, any type of algorithm may be utilized to determine paths and arcs through an LVS circuit.

As shown in FIG. 7, tracing process 440 includes sub-processes transistor trace 550a, node trace 550b and iterate 550c. Detailed descriptions of these processes will become clear as the invention is further described, specifically with respect to FIG. 9. Iterate sub-process 550c steps through all drive transistors in the LVS circuit under analysis.

According to one embodiment, a recursive methodology is employed to perform a depth-first search through an LVS circuit such that transistor trace process 550a calls node trace process 550b and vice-versa as a function of conditions encountered during the trace. A detailed description of transistor trace sub-process 550a and node trace sub-process 550b will become evident as the invention is further described (see FIG. 9 and accompanying text). However, in general transistor tracing sub-process 550a performs tracing operations with respect to transistors encountered in a depth-first walk through the LVS circuit and node trace sub-process 550b performs tracing operations with respect to nodes encountered in a depth-first walk through the LVS circuit.

Tracing process 440 and thereby sub-processes 550a, 550b and 550c act upon received input from topology analysis process 405, namely transistor list 430 node list 424 and SA list 437. It is assumed that topology analysis process has suitably prepared and structured transistor list 430, node list 424 and SA list 437 for operations effected by tracing process 440. In particular, as will be describe in depth with respect to FIG. 8 (below), topological analysis process 405 generates and structures transistor list 430, node list 424 and SA list 437 for processing by tracing process 405.

FIG. 7 also shows that tracing process utilizes input stack 602 for internally pushing and pulling of primary input values (gate values). The structure and function of input stack 602 will become evident as tracing algorithm 440 is described in detail with respect to FIG. 9.

FIG. 7 also shows that tracing process generates as output path list 603 comprising a list of path data objects 601, described above.

Figure 8:
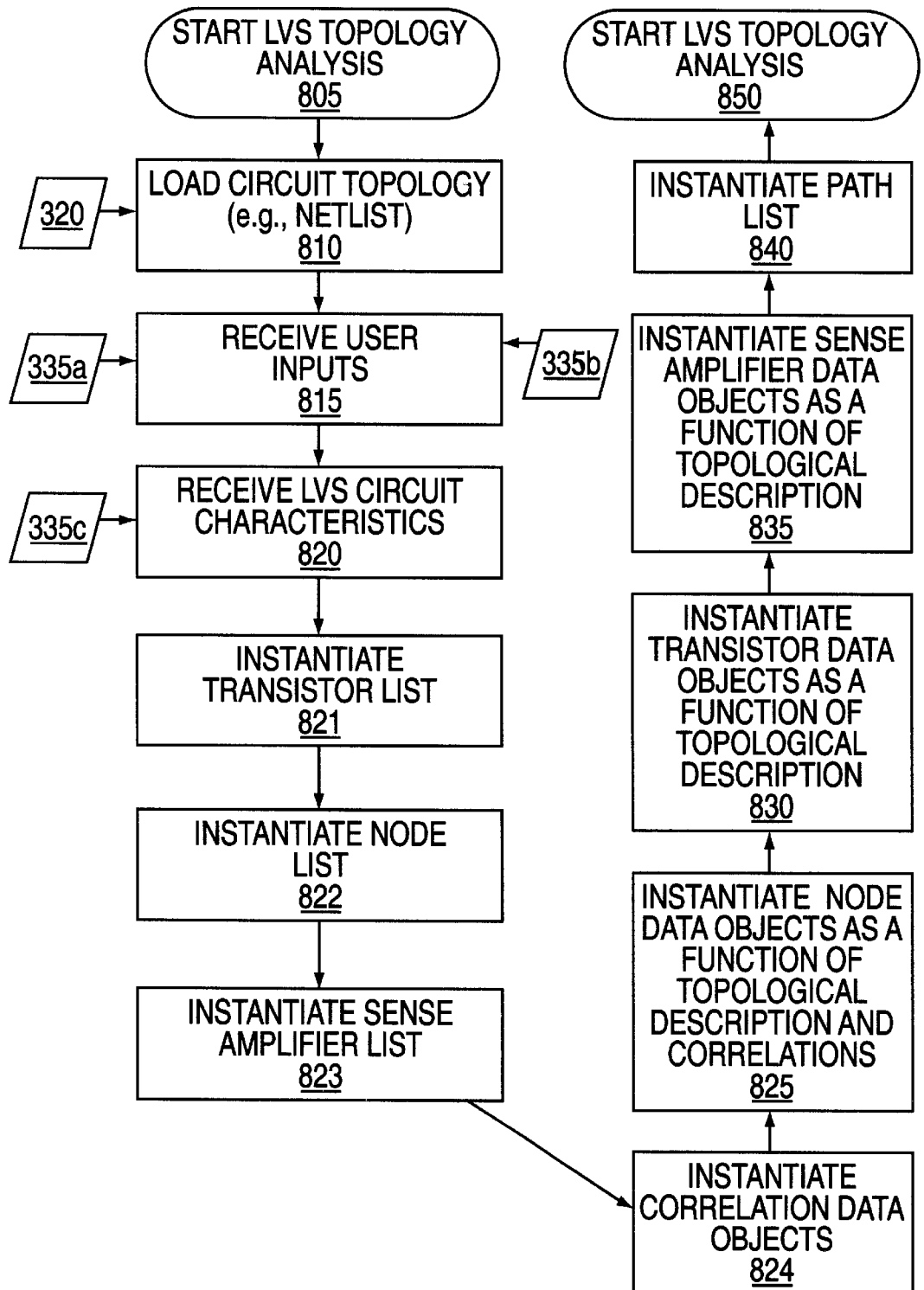
FIG. 8 is a flowchart that depicts an operation of a topological analysis process according to one embodiment of the present invention.

FIG. 8 is a flowchart that depicts an operation of a topological analysis process according to one embodiment of the present invention. Topological analysis process 425 establishes necessary data structures and analyzes topological data 320 to build a topological model of the LVS circuit for analysis by tracing process 440.

Topological analysis process 405 is initiated in step 805. In step 810, topological data 320 (e.g., a netlist) for the circuit is loaded. In step 815 user input data including ignored devices and clocks 335a and mutex and logical correlation data 335b is loaded. In step 820, circuit characteristics data 335c is loaded. The nature of user input data 335a (ignored devices and clocks) and mutex and logical correlation data 335b and characteristics data 335c is described above.

In steps 821, 822 and 823 transistor list 430, node list 424 and SA list 437 are each respectfully instantiated. According to one embodiment, transistor list 430, node list 424 and 437 are implemented utilizing a C++ class architecture although other implementations are possible. Furthermore, according to one embodiment of the present invention, transistor list 430, node list 424 and SA list 437 and node list 424 are implemented utilizing a linked list data structure. However, this is merely exemplary and the present invention is compatible with any type of data structures for storing and representing the output of topological analysis process 425.

In step 824, correlation data objects 537 are instantiated as a function of mutex and logical correlation data 335b. In particular, for each mutex or logical correlation relation provided in 335b, a corresponding correlation data object 537 is instantiated. For each correlation data object 537, the following data relations are established. Correlation type member variable 537 is assigned based upon whether the relation is a mutex or logical relationship. A string variable (i.e., a char) is generated for storing the mutex or logical correlation and a pointer to the string variable is stored in member variable string pointer 557. Auxiliary information relating to the mutex or logical correlation is assigned to auxiliary information fields 559 and 561 respectively.

In step 825, node data objects 517 are instantiated as a function of topological description data 320 and stored in node list 424. Thus, for each node in the LVS circuit, a node data object 517 is instantiated and added to node list 424. In particular, the following data relations are established for each node data object 517 corresponding to a physical node in the LVS circuit. A 32-bit node ID is generated and assigned to node ID member variable 530 of the node data object 517. For any correlations corresponding to the node, a pointer to the respective correlation data object (instantiated in step 824) is stored in correlation data object member variable 537. If the node is directly connected to Vss, Vcc etc., an identifier for the corresponding voltage source is stored in source member variable 536. Status member variable 539 is set to "not visited" status.

In step 830, transistor data objects 501 are instantiated as a function of topological description data 320. Thus, for each transistor in the LVS circuit, a transistor data object 501 is instantiated and added to transistor list 430. In particular, the following data relations are established for each transistor data object 501 corresponding to a transistor in the LVS circuit. A 32-bit transistor identifier is assigned and transistor ID member variable 505 is set to this value. As a function topological description data 320, the source, drain and gate nodes of the transistor are determined and source node member field 510, drain node member field 515 and gate node member field 516 are respectively set to the corresponding node identifiers (530), which were generated in step 825. As a function of characteristics data 335c, the function of the transistor is determined (i.e., drive, reset, pass) and function member variable 520 is set appropriately. According to one embodiment where precharge is low, for example, p-MOS transistors are assigned drive status, n-MOS transistors coupled to ground are assigned reset status and n-MOS transistors coupled to intermediate nodes are assigned pass status. For pre-charge high, the functional analysis would typically be inverted. That is, n-MOS transistors would be assigned drive status, p-MOS transistors coupled to ground would be assigned reset status and p-MOS transistors coupled to intermediary nodes would be assigned pass status. Of course, functional analysis of transistors can be determined by any criteria desired by the circuit designer and the functional analysis can proceed utilizing any desired framework. Thus, the present invention is compatible with any functional analysis scheme required for particular applications.

In step 835, SA data objects 527 are instantiated and stored in SA list 437. Thus, for each SA in the LVS circuit, a SA data object 527 is instantiated and added to SA list 437. In particular, the following data relations are established for each SA data object 527 corresponding to a SA in the LVS circuit. A 32-bit SA identifier is assigned and SA ID member variable 540 is set to this value. As a function topological description data 320, the +input, −input, +output node 549 and −output node 551 of the SA 130 are determined and +input node member field 545, −input node member field 547 and output node 549 are respectively set to the corresponding node identifiers (530), which were generated in step 825.

In step 840, an empty path list 603 is instantiated.

Figure 9:
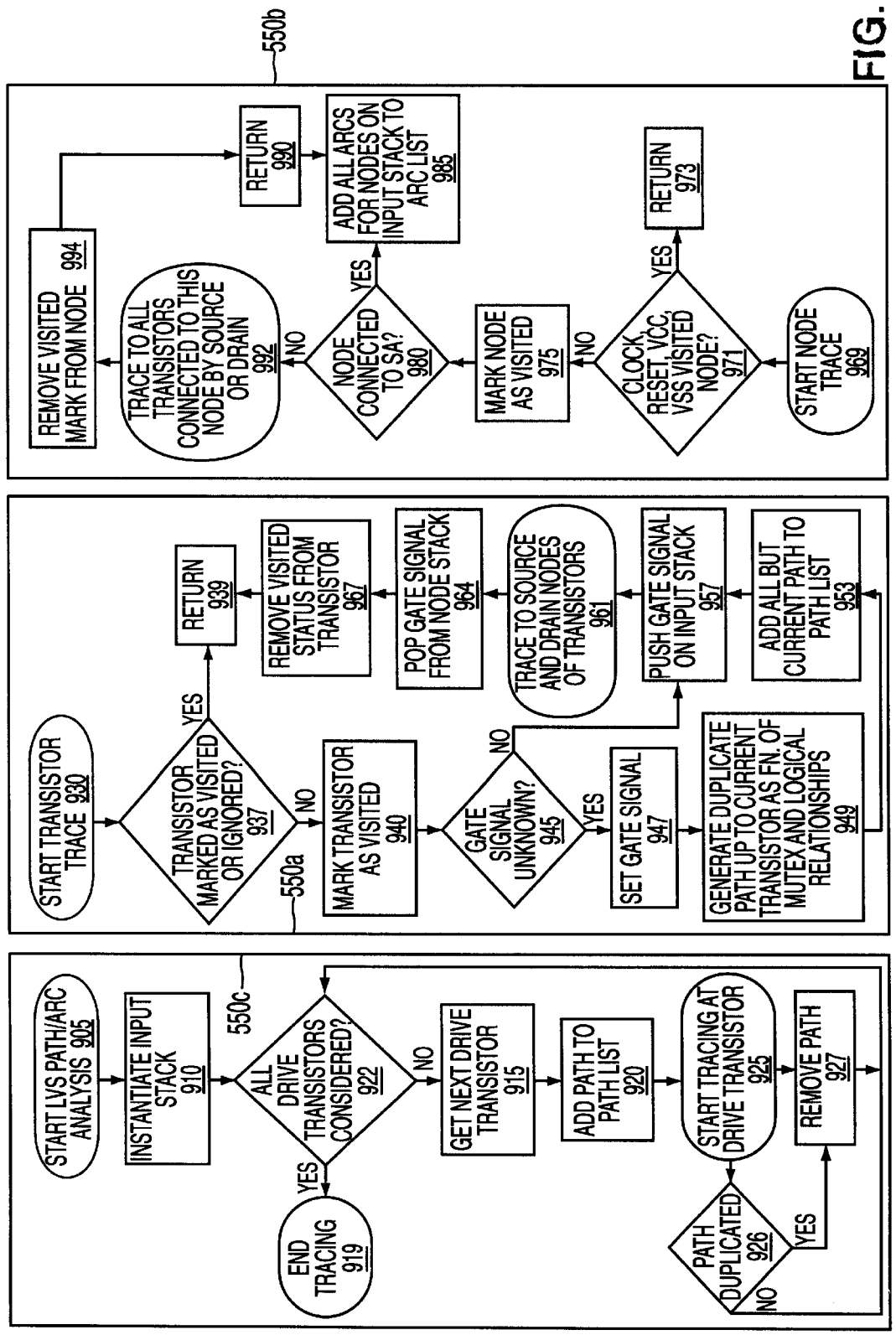
FIG. 9 is a flowchart that depicts the operation of a tracing analysis process according to one embodiment of the present invention.

FIG. 9 is a flowchart that depicts the operation of a tracing analysis process according to one embodiment of the present invention. FIG. 9 corresponds to the following pseudo-code:

Create an empty list of paths
For each drive transistor
Add a path to the path list
Start tracing at the drive transistor
When tracing to a transistor
   Skip the transistor if it is marked as visited or ignored and return
   Mark the transistor is visited
   If the gate signal is unknown
      Set the gate signal, splitting the path to accommodate node relationships
      Add all but he first copy of the split path to the path list
   Push the gate signal on the node stack for arcs
   Trace to the source and drain nodes of the transistor
   Pop the gate signal from the node stack
   Remove the visited mark from the transistor and return
When tracing to a node
   Skip clock nodes, reset nodes, Vcc, Vss and nodes that are marked as visited and return
   Mark the node as visited
   If the node is connected to a SA, add arcs from all nodes on the stack to this node Trace to all transistors connected to this node by source or drain
Remove the visited mark from this node and return
Check if the path (vector) is identical to an existing path. If so, discard path.

According to one embodiment, and as shown in FIG. 9, tracing process includes iterate sub-process 550c, transistor trace sub-process 550a and node trace sub-process 550b. Further, as described above, according to one embodiment a recursive methodology is utilized such that transistor trace sub-process 550a is called by iterate sub-process 550c and node trace sub-process 550b and node trace sub-process 550b is called by transistor trace sub-process to step through the LVS circuit. For example, in one embodiment implemented utilizing a C++ class structure, iterate sub-process 550c, transistor trace sub-process 550b and transistor trace sub-process 550a would be implemented as member functions according to the following prototype:

```
Class LVS_TRACE{
    Void Iterate(Void);
    Void Transistor_Trace(Transistor_Object Transistor);
    Void Node_Trace(Node_Object Node);
}
```

Iterate sub-process 550c steps through all transistors in the LVS circuit under analysis. Iterate sub-process 550c is initiated in step 905. In step 910, input stack 602 is instantiated. As described in detail below, input stack provides a mechanism for maintaining state as the tracing process evolves. In step 922, it is determined whether all drive transistors have been considered. If so ('yes' branch of step 922), in step 919, the tracing process terminates. Otherwise, ('no' branch of step 922), in step 915 the next drive transistor is fetched. According to one embodiment, function member field 520 of transistors data object 501 stores an identifier indicating the function of the corresponding transistor. Thus, according to one embodiment, in order to locate the next drive transistor, transistor list 430 is searched to locate the next transistor data object 501 with function member field 520 indicating drive status.

In step 920, a new path data object 601 is instantiated and added to the path list 603, which was instantiated by topology analysis process 405. In step 925, a call is made to transistor trace sub-process 550a with the current drive transistor as input argument. In step 926, it is determined whether the determined path is identical to a path already determined. If not ('no' branch of step 926) flow continues with step 922 and a new drive transistor is considered. If so ('yes' branch of step 926) the path is discarded in step 927 and a new drive transistor is considered in step 922.

Transistor trace sub-process 550a traces to the next transistor specified in the input argument and is initiated in step 930. In step 937, it is determined whether the transistor under analysis is marked as visited or ignored. In particular, status member 522 of transistor data object 501 is examined to determine whether the transistor has been marked as visited or ignored. If the transistor is marked as visited or ignored ('yes' branch of step 937), in step 939 the process ends and control is returned to the calling process. Otherwise, if the transistor is not marked as visited or ignored ('no' branch of step 937), in step 940, the transistor is marked as visited by appropriately setting status member 522 of the corresponding transistor data object 501.

In step 945, it is determined whether the gate signal for the transistor is unknown (i.e., whether it has been assigned a signal value for the current path). According to one embodiment, this is determined by checking input vector 605 corresponding to the current path list data object 601 for the transistor gate signal under consideration. If the gate signal is not unknown ('no' branch of step 945), the known gate signal is pushed on input stack 602 in step 957.

If the gate signal is unknown (i.e., assigned X value), in step 947 a gate signal is chosen (either 0 or 1), and the primary input data object 60 in the input vector 605 corresponding to the current path list is set accordingly.

In step 949, a duplicate copy of the path up to the current transistor is generated as a function of mutex and logical relationships associated with the node connected to the gate input of the transistor currently under analysis. Tracing continues with the current path and all duplicated paths are also traced (that is iteration occurs for the current path and all duplicate paths). According to one embodiment, invert relations and nodes with no relations split the path into two copies: the first with the gate node set so the transistor is on and the second so that the transistor is off. Mutex relations split the path such that a copy of the path exists for each node in the mutex relationship, each copy having a single transistor turned on. Logical relations split the path for each member for the power set of auxiliary variables describing the relationship. When a path is split, the path search continues with the first split copy. Other copies are placed in a path list 603 and are traced later starting with the same drive transistor but with some nodes preset. This solution yields correct paths and also many "dead ends" (i.e. paths that never reach the input of a sense amplifier), which are discarded.

According to one embodiment, inverse relations are assumed by the naming convention a and a#. Logical correlation is represented in a generic equation format (e.g., a &(!b+c)). Mutex and logical relationships are marked with appropriate attributes. When tracing arrives at a transistor that has a mutex or logical attribute attached to its gate, that transistor is set so the transistor is on. Any transistor gate that becomes defined from asserting the traced transistor gate will be set on or off When tracing arrives at a transistor that has been turned off by logical or mutex relationships, the trace will not connect the source and drains in the path and the trace may terminate.

In particular, correlation data object 537 corresponding to the node connected to the gate signal for the current transistor is examined. Based upon the mutex or logical relation specified the string pointed to by string pointer 557, appropriate primary input data objects 607 are set in input vector 605 corresponding to the current path list data object 601.

According to one embodiment, a power set of all node parameters specified in the mutex or logical relation is generated. Then, a duplicate path list data object 601 is instantiated for all members of the power set corresponding to valid relations (i.e., those generating a truth value of 1). Furthermore, for each duplicate path, input vector 605 of the current path is copied into the duplicate path and those input relations necessary to produce a truth value of '1' for the power set member corresponding to the duplicate path are also set in input vector 605 for that path data object 601. Also, a duplicate path up to the current transistor is generated corresponding to the gate signal that was not selected in step 947. This is equivalent to setting a mutex relationship for every primary input node x as 'x'. Thus, if a '1' were selected in step 947 for a particular gate, a duplicate path is also established for an input value of '0' on the gate.

In step 953, all duplicate paths created in step 949 are added to path list 603. In step 957, the gate signal selected is pushed onto input stack 602. In step 961, node tracing process 550b is called for the nodes connected to the source and drain nodes of the current transistor.

In step 964, input stack 602 is popped to remove the gate signal at the top of the stack 602. In step 967, status member 539 of transistor object 501 corresponding to the current transistor is changed to 'not visited'. In step 939, a return statement is issued, the current call to transistor trace sub-process 550a ends and control is returned to the calling process (either iterate sub-process 550c or node trace sub-process 550b).

Node trace sub-process 550b traces to the next node specified in the input argument and is initiated in step 969. In step 971, it is determined whether the current node (the node provided in the input argument) is either a reset node, Vcc, Vss or has 'visited' status. This is determined by checking status member 539 and source member 536 of node data object 517 corresponding to the current node. If the current node is a clock node, Vss, Vcc or has visited status ('yes' branch of step 971), in step 973 a return statement is issued the current call to the node trace process ends and control is returned to the calling process (transistor trace sub-process 550a).

In step 975, the current node is marked as visited by setting status member 539 of node data object 517 to 'visited' status. In step 980, it is determined whether the current node is connected to a SA 130. This may be accomplished by searching SA list 437 to determine whether the current node corresponds to either +input node 545 or −input node 547 of any SA data objects 527 in the list. If the current node is connect to a SA ('yes' branch of step 980), in step 985 all arcs for nodes on input stack 602 are added to arc list 610 for the current path list 601. Instep 990, a return statement is issued, the current call to node trace sub-process 550b ends and control is returned to the calling process (transistor trace sub-process 550a).

If the current node is not connected to a SA 130 ('no' branch of step 980), in step 992 transistor trace sub-process 550a is called for all transistors connected to the current node by source or drain. In step 994, 'visited' status is changed to 'not visited' status for the current node by appropriately setting status member 539 of node data object 517. In step 990, a return statement is issued, the current call to node trace sub-process 550b ends and control is returned to the calling process (transistor trace sub-process 550a).

The output of tracing process 440 (path list 603) is then passed to circuit simulation tool 350 for simulation and timing verification. Typically, in order to determine setup and hold times, a circuit is simulated while sweeping the clock to find where a latch fails. Because of the number of simulations required, this cannot be done for an LVS circuit. Instead, according to one embodiment, the SAs 130 are precharacterized by simulating them with a table of input waveforms. The table consists of waveforms with different maximum differentials, lead times and trail. The clock is then swept for each of these waveforms to determine the earliest and latest valid clock times of the circuit. Setup and hold times are then determined by comparing the actual output waveform from the LVS DCN 120 to the entries in the table and interpolating to find the earliest and latest allowable clock times for that waveform. The input arrival times are then subtracted off to get the setup and hold times.

Figure 10:
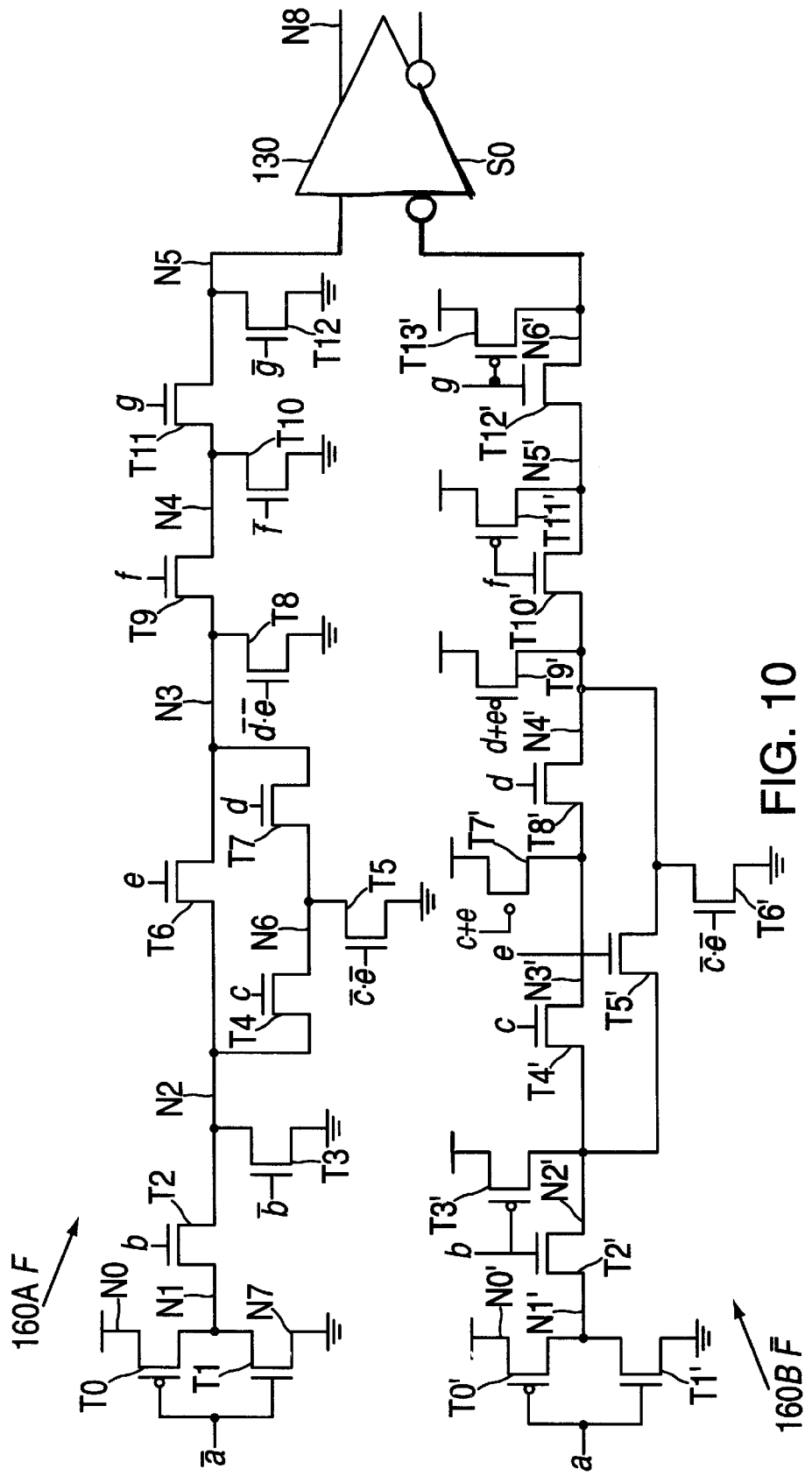
FIG. 10 is a schematic of an exemplary LVS circuit, which may be analyzed by an LVS circuit analysis system according to one embodiment of the present invention.

FIG. 10 is a schematic of an exemplary LVS circuit, which may be analyzed by an LVS circuit analysis system according to one embodiment of the present invention. The circuit shown in FIG. 10 implements the function abefg+abcdfg. Note that the upper network of the circuit 160a pertains to F and the lower network 160b pertains to F'. Upon entering the schematic into appropriate schematic editor 310, topological description 320 is generated indicating connectivity information as well as designation of primary inputs (in this case a, a', b, b', c, c', d, d', e, e' f, f', g and g'). Based upon topological description 320, LVS path arc analysis tool 330 performs topological analysis of the circuit (via topology analysis process 440) utilizing user inputs 335a–335c. In particular, topology analysis process 440 creates transistor list 430, node list 424 and SA list 437 pertaining to the circuit.

Figure 11:
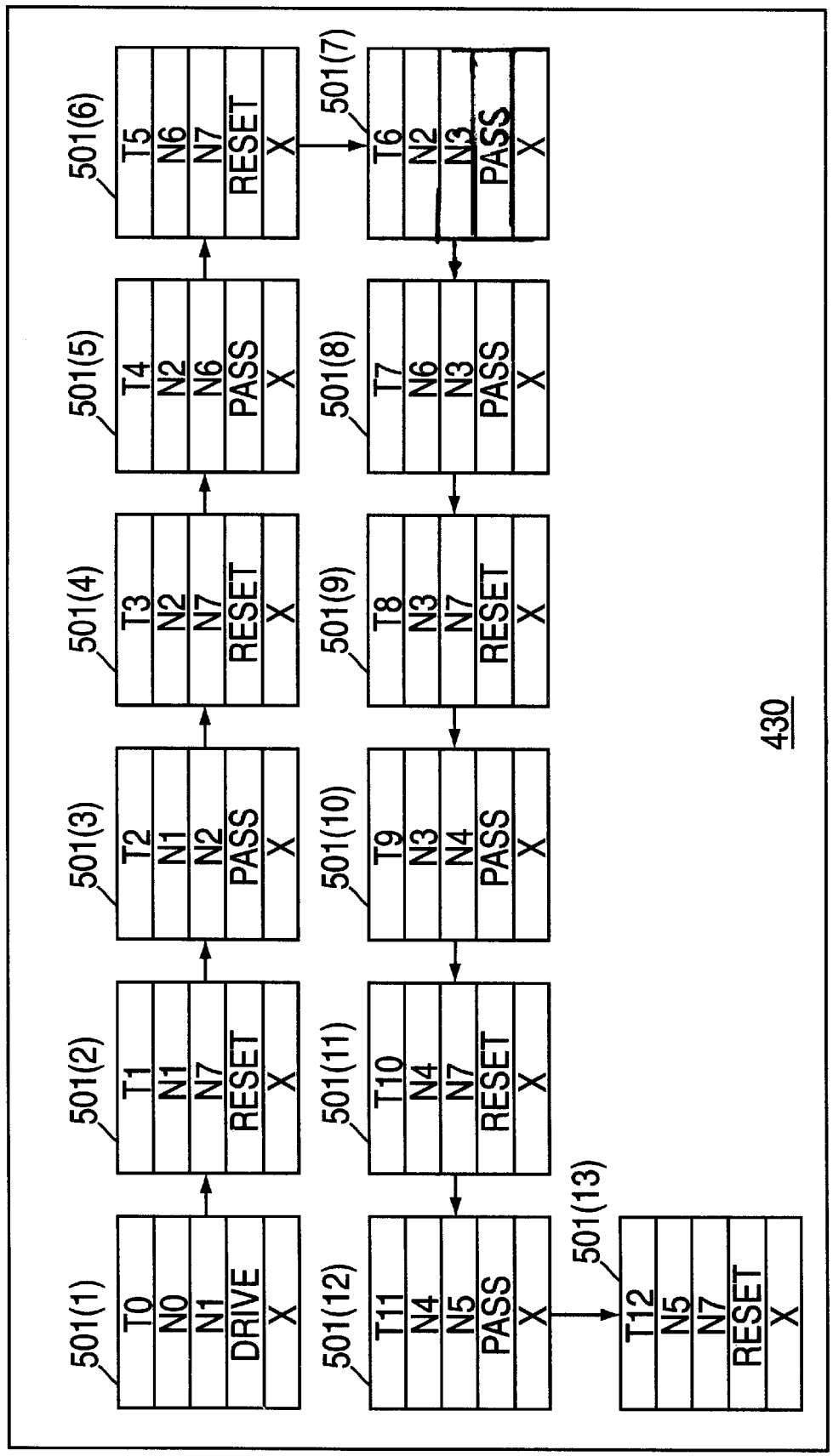
FIG. 11 depicts an exemplary transistor list for the circuit shown in FIG. 10 generated by a topology analysis process according to one embodiment of the present invention.

FIG. 11 depicts an exemplary transistor list for the circuit shown in FIG. 10 generated by a topology analysis process according to one embodiment of the present invention. As shown in FIG. 11, transistor list 430 includes transistor data objects 501 corresponding T0–T11 for F 160a. Transistors corresponding to F' 160b (T0'–T13') are not shown. Note that function member 520 is populated according to the function of each transistor. Furthermore, status field is set to X indicating that the transistor has not been visited. Had the circuit designer indicated that certain transistors should be ignored, status member 522 would be set appropriately.

Figure 12:
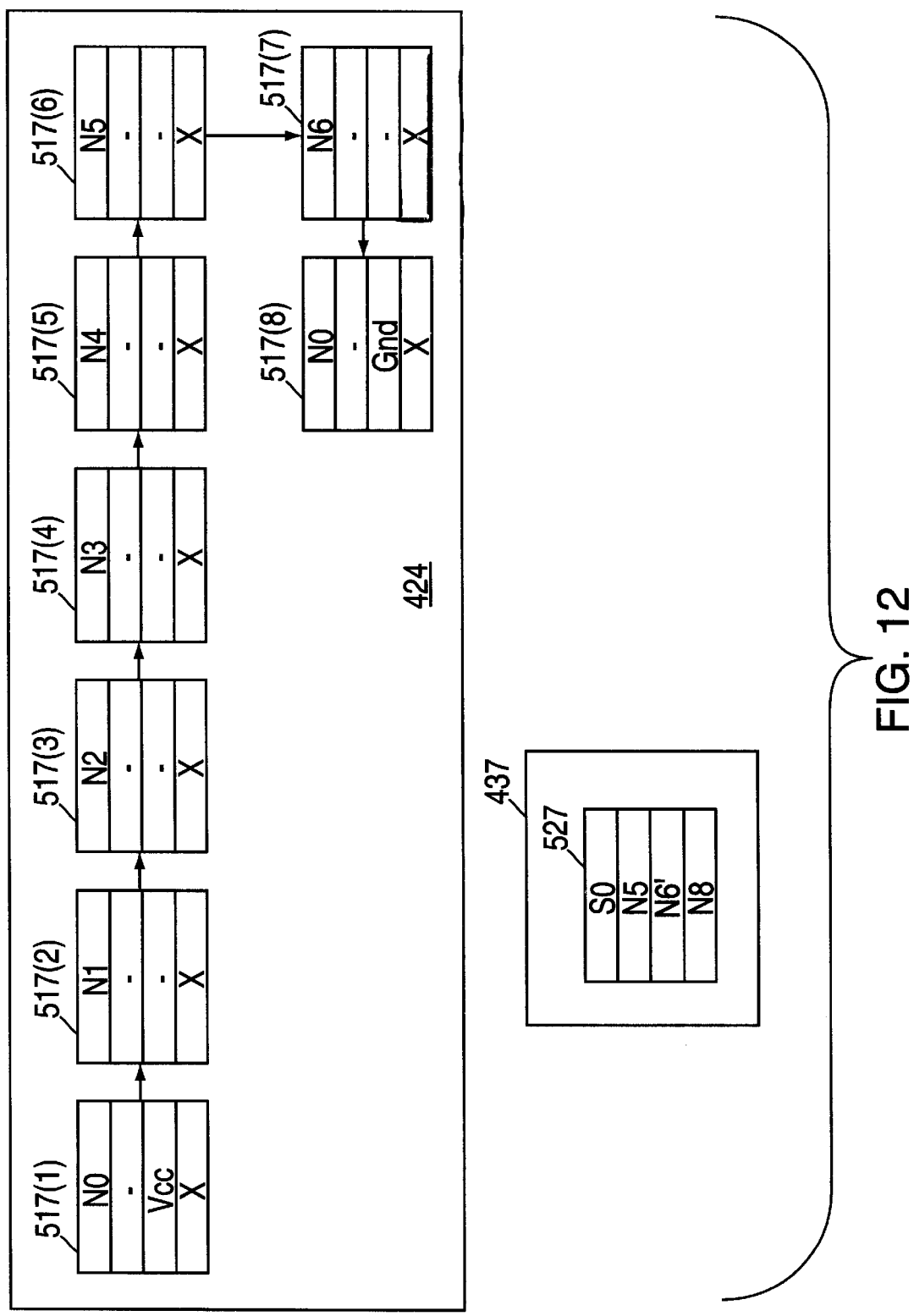
FIG. 12 depicts an exemplary node list and sense amplifier list for the circuit shown in FIG. 10 according to one embodiment of the present invention.

FIG. 12 depicts an exemplary node list and sense amplifier list for the circuit shown in FIG. 10 according to one embodiment of the present invention. As shown in FIG. 12, node list 424 includes node data objects 517 corresponding nodes N0–N7 for F 160a. Nodes corresponding to F' 160b (N0'–N7') are not shown in FIG. 12. Note that status field 539 of each node data object 517 is set to 'X' indicating that the node has not been visited. FIG. 12 also shows sense amplifier list 437 corresponding to the circuit shown in FIG. 10. In this case, sense amplifier list 437 includes a single sense amplifier data object 527 corresponding to sense amplifier 130 shown in FIG. 10.

It is assumed for purposes of this example that no correlation data has been defined for the circuit shown in FIG. 10.

Figure 13:
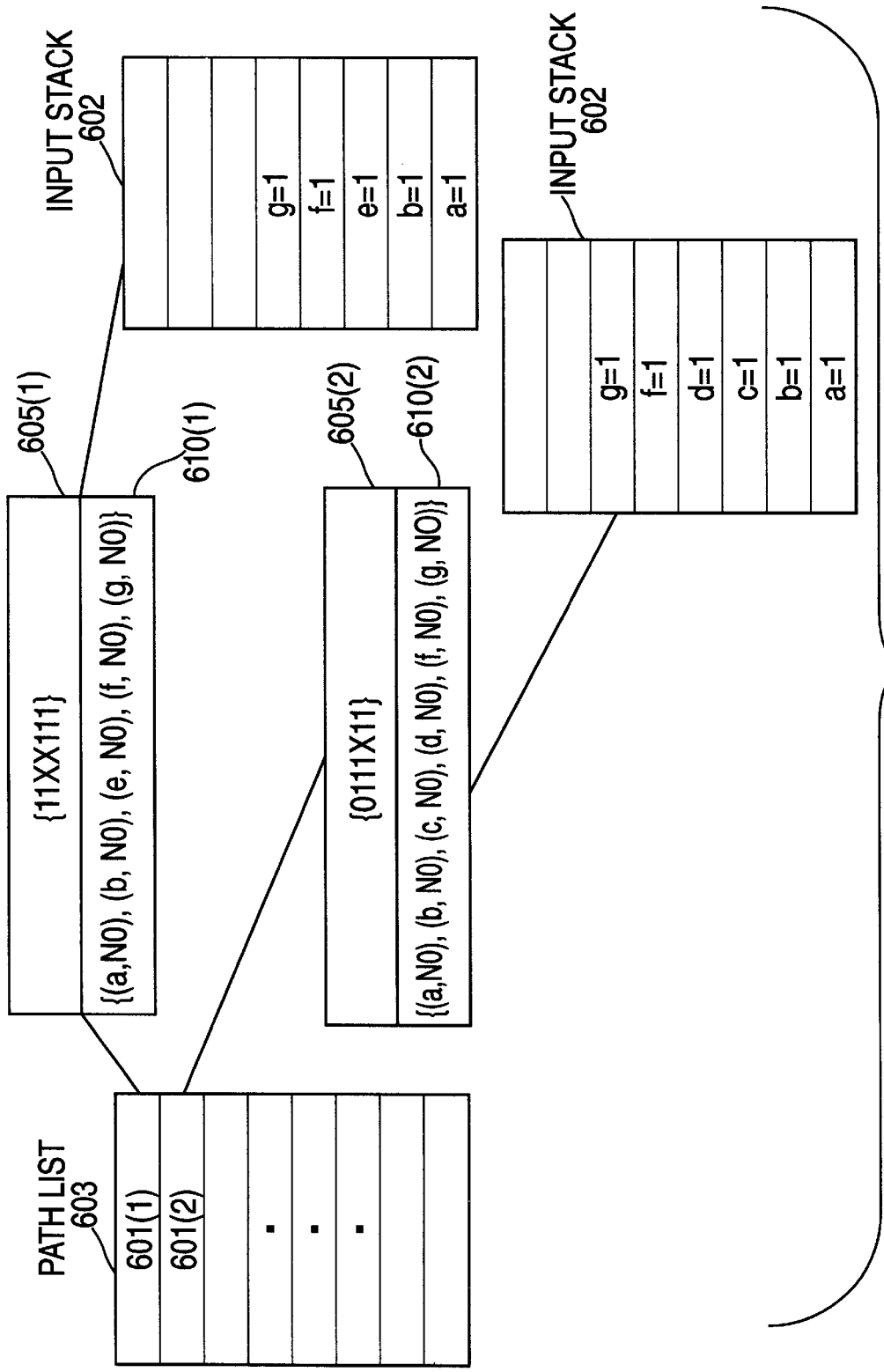
FIG. 13 shows an exemplary output of the paths traced through F of the circuit shown in FIG. 10.

Tracing process 440 receives the output generated by topology analysis process 405 (namely transistor list 430, node list 424 and sense amplifier list 437). FIG. 13 shows an exemplary output of the paths traced through F 160a of the circuit shown in FIG. 10. In particular, path list 603 includes two path data objects 601(1) and 601(2). As shown in FIG. 13, path data object 601(1) includes input vector 605(1) set to {11XX111} (indicating primary inputs set to abefg) and corresponding arc list 610(1) set to {(a, N0), (b, N0), (e, N0), (f, N0), (g, N0)}. FIG. 13 also shows the state of input stack 602 upon generation of path data object 601(1) (also indicating primary inputs set to abefg).

Similarly FIG. 13 shows path data object 602(2) including input vector 605(2) set to {0111X11} (indicating primary inputs set to abcdfg) and corresponding arc list 610(2) set to {(a, N0), (b, N0), (c, N0), (d, N0), (f, N0), (g, N0)}. FIG. 13 also shows the state of input state 602 upon generation of path data object 601(2) (also indicating primary inputs set to abcdfg). Note that FIG. 13 does not depict the paths traced through F' 160b of the circuit shown in FIG. 10.

Figure 14:
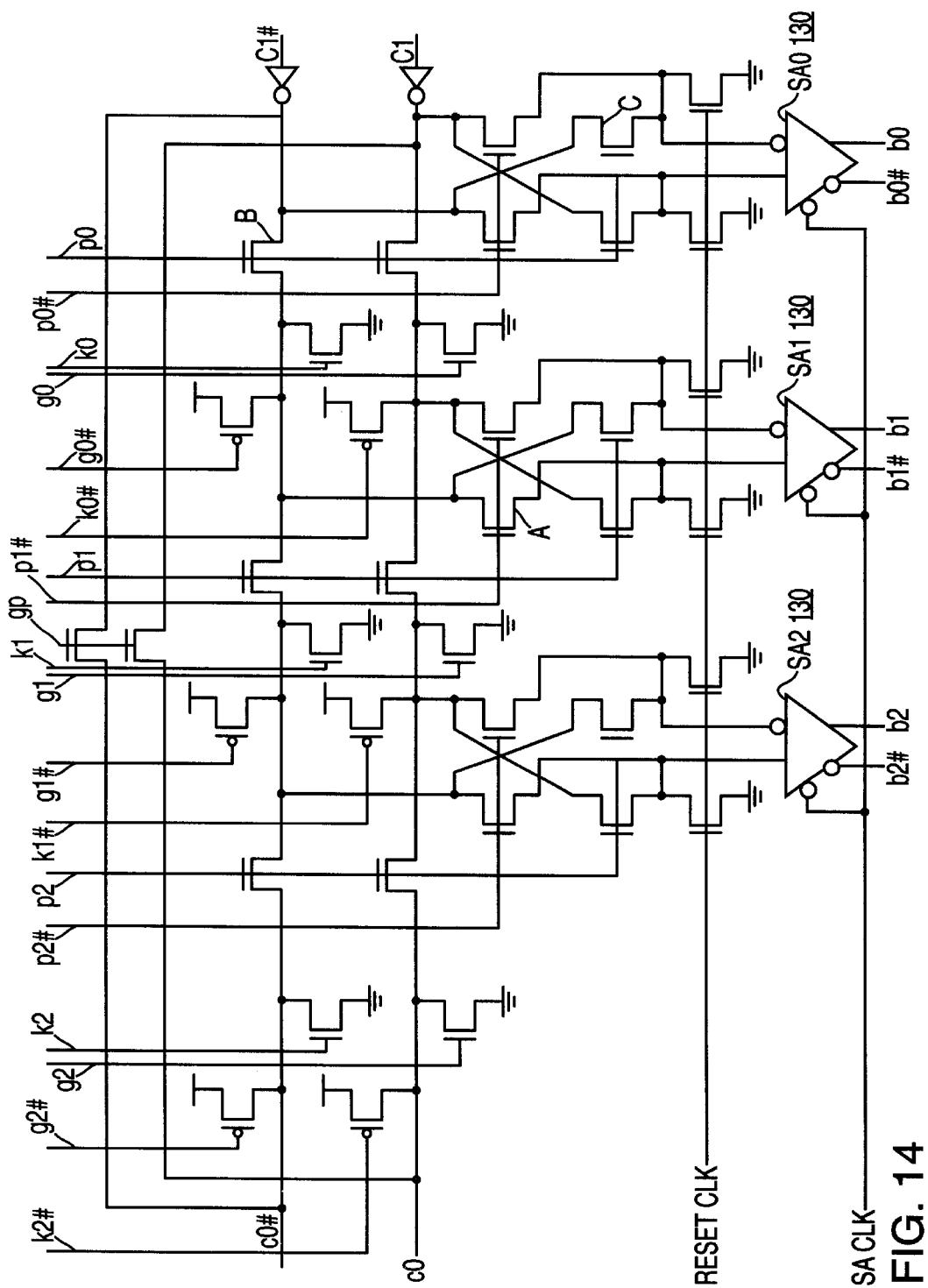
FIG. 14 is a schematic of an exemplary 3-bit Manchester carry chain circuit implemented using LVS technology, which may be analyzed by an LVS circuit analysis system according to one embodiment of the present invention.

FIG. 14 is a schematic of a portion of an exemplary 3-bit Manchester carry chain circuit implemented using LVS technology, which may be analyzed by an LVS circuit analysis system according to one embodiment of the present invention. Application of the present invention to the circuit shown in FIG. 14 illustrates many of the attributes and advantages of the present invention. In particular, the present invention generates LVS paths that avoid circular paths in a DCN network. The avoidance of circular paths is achieved by utilizing status flag 539 of node data object 517 and status flag 522 of transistor data object 501 by indicating 'visited' or 'not visited' status. Thus, referring to FIG. 14, a cycle exists through pass transistors gated with p0, p1, p2 and gp. As transistor trace process "walks" through the 3-bit Manchester carry chain, these circular paths are avoided.

In addition, due to the nature of LVS circuits, multiple outputs can create bogus arc dependencies. A node may be connected to two transistors, one driving one SA 130 and the other driving a different SA. For example, referring to FIG. 14, if p0 and p1# are asserted, the transistor labeled A should not have a timing arc to SA0 130 even though a path through devices A, B and C reach SA0 130. Incorrect arc dependencies are avoided by pushing gate nodes of transistors in the path onto input stack 602 while the device is being traced and popping them off when the path completes to a sense amp. In this case, the gate of transistor A will be removed once the node driving to SA1 130 is completed and will not create an arc to SA0 130.

Furthermore, certain transistors should be ignored from a trace. For example, transistors driven by clocks must not be modified by tracing process 440. Likewise, for efficiency, some redundant transistors (such as the transistor driven by gp in FIG. 14) can be ignored. Transistors tagged with the ignore property in status field 522 of transistor data object 501 will be ignored by tracing process 440.

Also, importantly, unmodeled correlation can create false paths. The circuit designer of a DCN 120 can be optimized using knowledge of the logical relations on the inputs. The timing tool must have the capability to reason about these relations or false and incorrect vectors will be generated. For example, in the portion of the Manchester carry chain shown in FIG. 14, both generate and kill cannot be asserted as this would both pull up and pull down a node in the DCN. As tracing process allows specification of mutex, inverse and generic logic correlation between any node connected to a transistor gate via correlation data object 537, these false paths based upon unmodeled correlation can be eliminated. For example, assume that the gate of transistor A is associated with the correlation data object 537 !x&y and transistor B is associated with the correlation data object x&!y. Upon tracing to transistor A or B the power set of x and Y are calculated as (x,y)={(0,0), (0,1), (1,1), (1,0)}. Transistor A will be on for only the second split. If the trace arrives at transistor B, it will only be asserted on the fourth split.

What is claimed is:

1. A method for determining paths and arcs through an LVS ("Low Voltage Differential Sense") circuit, the LVS circuit including at least one transistor and at least one sense amplifier, the method comprising:
   (a) receiving a topological description of the LVS circuit;
   (b) determining a function for each transistor in the LVS circuit as one of a drive transistor, a reset transistor and a pass transistor;
   (c) determining at least one path from a transistor having a drive function to a sense amplifier; and
   (d) for each pat, determining an associated arc vector.

2. The method according to claim 1, wherein part (b) includes analyzing LVS circuit characteristics information, the LVS circuit characteristics information specifying at least pre-charge information pertaining to the LVS circuit.

3. The method according to claim 2, wherein if the LVS circuit utilizes a high pre-charge scheme, then p-MOS transistors coupled to power are characterized as drive transistors, transistors coupled to ground are characterized as reset transistors and transistors coupled to intermediate nodes are characterized as pass transistors.

4. The method according to claim 1, wherein part (c) includes performing a depth first search from each transistor characterized as a drive transistor to a sense amplifier.

5. The method according to claim 4, wherein part (c) further includes starting with a transistor characterized as a drive transistor, recursively executing a transistor tracing process and a node tracing process until a sense amplifier is reached.

6. The method according to claim 5, wherein the transistor tracing process performs the following:
   (i) receiving a current transistor;
   (ii) if the current transistor is assigned a visited status, returning from the transistor tracing process;
   (iii) associating the current transistor with a visited status;
   (iv) setting a gate signal for the current transistor;
   (v) storing the gate signal for the current transistor;
   (vi) executing a node tracing process to trace to a source node of the current transistor;
   (vii) executing the node tracing process to trace to a drain node of the current transistor;
   (viii) disassociating the current transistor with a visited status; and
   (ix) returning from the transistor tracing process.

7. The method according to claim 5, wherein the node tracing process performs the following:
   (i) receiving a current node;
   (ii) if the current node is coupled to a power source, ground, or a clock, returning from the node tracing process;
   (iii) associating the current node with a visited status;
   (iv) if the current node is coupled to a sense amplifier, determining a path as a function of at least one stored gate signal;
   (v) executing the transistor tracing process for all transistors coupled to the current node;
   (vi) disassociating the current node with a visited status; and
   (vii) returning from the node tracing process.

8. The method according to claim 7, wherein part (iv) further includes determining at least one arc from a stored gate transistor to a sense amplifier.

9. A system for determining paths and arcs through an LVS ("Low Voltage Differential Sense") circuit, the LVS circuit including at least one transistor and at least one sense amplifier, comprising:
   a processor, wherein the processor is adapted to:
      (a) receive a topological description of the LVS circuit;
      (b) determine a function for each transistor in the LVS circuit as one of a drive transistor, a reset transistor and a pass transistor;
      (c) determine at least one path from a transistor having a drive function to a sense amplifier; and
      (d) for each path, determine an associated arc vector.

10. The system according to claim 9, wherein the processor receives LVS circuit characteristics information, the LVS circuit characteristics information specifying at least pre-charge information pertaining to the LVS circuit.

11. The system according to claim 9, wherein the processor performs a depth first search from each transistor characterized as a drive transistor to a sense amplifier.

12. A medium storing instructions adapted to be executed by a processor to perform the following:
   (a) receiving a topological description of an LVS ("Low voltage Differential Sense") circuit;
   (b) determining a function for each transistor in the LVS circuit as one of a drive transistor, a reset transistor and a pass transistor;

(c) determining at least one path from a transistor having a drive function to a sense amplifier; and (d) for each path, determining an associated arc vector.

13. The medium storing instructions according to claim 12, wherein part (b) includes analyzing LVS circuit characteristics information, the LVS circuit characteristics information specifying at least pre-charge information pertaining to the LVS circuit.

14. The medium storing instructions according to claim 13, wherein if the LVS circuit utilizes a high pre-charge scheme, then p-MOS transistors coupled to power are characterized as drive transistors, transistors coupled to ground are characterized as reset transistors and transistors coupled to intermediate nodes are characterized as pass transistors.

15. The medium storing instructions according to claim 12, wherein part (c) includes performing a depth first search from each transistor characterized as a drive transistor to a sense amplifier.

16. A method for determining paths and arcs through an LVS ("Low Voltage Differential Sense") circuit, the LVS circuit including at least one transistor, at least one node, and at least one sense amplifier, the method comprising:

(a) receiving a topological description of the LVS circuit;

(b) receiving information pertaining to at least one of a mutex and a logical correlation corresponding to at least one node in the LVS circuit;

(c) determining a function for each transistor in the LVS circuit as one of a drive transistor, a reset transistor and a pass transistor;

(d) determining at least one path from a transistor having a drive function to a sense amplifier as a function of the information pertaining to the at least one of the mutex and the logical correlation; and (e) for each path, determining an associated arc vector.

17. The method according to claim 16, wherein part (d) includes performing a depth first search from each transistor characterized as a drive transistor to a sense amplifier.

* * * * *